United States Patent
Deiso, III et al.

[11] Patent Number: 6,046,652
[45] Date of Patent: *Apr. 4, 2000

[54] LOADING ELEMENT FOR EMI PREVENTION WITHIN AN ENCLOSURE

[75] Inventors: James William Deiso, III; Jose Patino Mendez, Jr., both of Austin; Ernest Lee Miller, Georgetown; Jerry W. Scibielski, Austin, all of Tex.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/829,021

[22] Filed: Mar. 31, 1997

[51] Int. Cl.⁷ .............. H01P 1/162; H01P 1/22; H01P 1/26
[52] U.S. Cl. .......... 333/12; 333/22 R; 333/81 A
[58] Field of Search ............ 333/12, 22 R, 333/81 A

[56] References Cited

U.S. PATENT DOCUMENTS

| | | | |
|---|---|---|---|
| 4,267,528 | 5/1981 | Thornberry | 333/12 |
| 4,672,335 | 6/1987 | Webster | 333/22 R |
| 4,716,389 | 12/1987 | Gawronski et al. | 333/81 A |
| 4,743,868 | 5/1988 | Katoh et al. | 333/12 |
| 4,796,079 | 1/1989 | Hettiger | 333/12 X |
| 5,027,089 | 6/1991 | Henke | 333/12 |
| 5,523,727 | 6/1996 | Shingyoji | 333/22 R |
| 5,693,595 | 12/1997 | Talisa et al. | 333/12 X |

FOREIGN PATENT DOCUMENTS

| | | | |
|---|---|---|---|
| 150902 | 7/1987 | Japan | 333/22 R |
| 25500 | 1/1989 | Japan | 333/22 R |
| 4602 | 1/1991 | Japan | 333/22 R |
| 4090601 | 3/1992 | Japan | 333/22 R |
| 4239202 | 8/1992 | Japan | 333/22 R |
| 1319118 | 6/1987 | U.S.S.R. | 333/81 A |

*Primary Examiner*—Benny Lee
*Attorney, Agent, or Firm*—Robert F. Wilder; Volel Emile

[57] ABSTRACT

A process and implementing construction includes an electrically independent EMI loading device comprised of an inner foam core surrounded by an electrically conductive envelope. The device is strategically positioned in resonant cavities located within a system enclosure housing electronic components and circuit boards and. In an example, the loading device is installed in a resonant cavity between a board-mounted component and an adjacent circuit board and is effective to decrease electromagnetic emission from resonating cavities.

15 Claims, 3 Drawing Sheets

LOADING ELEMENT FOR EMI PREVENTION WITHIN AN ENCLOSURE

FIELD OF THE INVENTION

The present invention relates generally to electronic signal processing systems and more particularly to techniques and methods for the suppression of electromagnetic fields which may emanate from such systems.

BACKGROUND OF THE INVENTION

Computer systems have attained widespread use for providing personal computing capability to many segments of today's modern society. Computer systems can usually be defined as desktop, floor standing or portable microcomputer that consists of a system unit having a system processor(s) and associated volatile and non-volatile memory, a display monitor, a keyboard, one or more diskette drives, a fixed disk storage unit, and optional printers. One of the distinguishing characteristics of these systems is the use of a motherboard or system planar board to electrically connect these components together. These systems are designed primarily to give independent computing capability to users and are available for purchase by individuals and businesses.

It is well known that the components of a computer housed within an enclosure and supported from the chassis or connected with the planar board are capable of emitting electromagnetic radiation at various frequencies and that standards have been established for limiting the emissions of such energy to various limits depending on the environment of use of the computer. Further, it is known that higher speed processors and circuits associated with such processors typically emit radiation of differing frequencies and amounts than the earlier designed slower processors. Heretofore, shielding has been found to be an effective means for limiting radiation. Shielding has been accomplished in various ways including providing metal enclosures, and coating or lining the enclosures and covers provided. In achieving shielding in these ways and attenuating radiation, it has been noted that openings provided in such disclosures and covers can present particularly difficult problems in shielding. Further it has been noted that the possible effects of electromagnetic interference can be interruption of or interference with other electronic devices as well as input/output signals necessarily exchanged with the operating components of the microcomputer.

As the development of computer technology has advanced, computers have been established to incorporate increasingly higher data handling speeds in processors, data storage devices and memory. Such higher speeds bring with them greater emissions of electromagnetic radiation, increasing the demand placed on enclosures for the attenuation of such emissions. Other terms used to refer to such requirements have been electromagnetic compatibility and suppression of electromagnetic interference. In efforts to bring emissions within the required standards while attaining the desired high speeds, designs have moved toward a completely shielded enclosure with minimal gaps and openings.

In addition, under Federal Communication Commission (FCC) and European laws, before computer hardware can be offered for sale, it must first meet specific Electromagnetic Compatibility (EMC) requirements. With increasing CPU speeds, each new system or upgrade needs to be tested for compliance with the various regulations. A computer system that has passed such requirements in the past, will need to be re-tested when it receives an upgraded faster CPU since higher internal frequencies will cause different cavities within the box to resonate and emit radiation. Such new radiation may also be introduced because faster CPUs require different support circuits thereby creating a substantially new combination of electromagnetic radiators within a differently structured and configured CPU enclosure. New components will change the geometry of the radiating structures and spaces between components within the CPU enclosure. Practically all computer enclosures can support a resonance if the right dimensional conditions exist. Higher frequencies will cause higher order harmonics to resonate even smaller cavities within a system enclosure. Thus, higher order harmonics are more likely to cause an emission testing failure than has been the case in the past with relatively slower speed processors.

Moreover, in many cases the resonance is so strong that no practical amount of box level shielding could reliably contain the radiated energy of higher speed systems to a level below the EMC radiated limits. Frequently, the mechanical dimensions for newly created cavities within a system enclosure are so well tuned to support an undesired resonance and resulting radiation, that reducing the level of source excitation via decoupling and filtering are ineffective. In this case, typical box shielding and source suppression techniques are generally found to be neither practical nor effective for higher frequency systems. Thus there is a need for an improved method and apparatus for effectively limiting EMC radiation which has resulted from the evolution and implementation of higher speed computer systems and other electronic devices.

SUMMARY OF THE INVENTION

A method and implementing system are provided in which resonant cavities within an electronics housing are modified and loaded with EMC absorbing and reflecting material to break up resonant conditions which would otherwise result in the emission of unacceptable electromagnetic radiation. In one exemplary embodiment, a radiation limiting electrically independent loading device is located within a cavity of an electronics enclosure or housing. The device is comprised of an inner core of lossy foam-type material and at least partially covered by an envelope of electrically conductive material. The device is electrically independent of electrical connections to system ground or other reference potentials.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
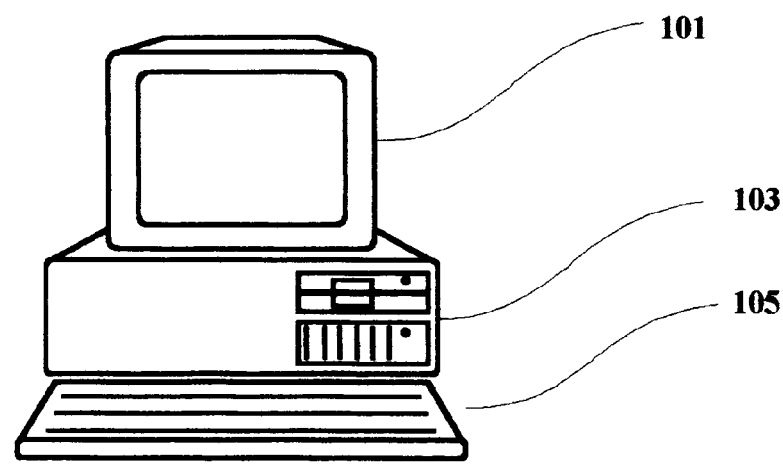
FIG. 1 is simplified schematic diagram of a computer system which is used to illustrate several of the advantages of the present invention.

In FIG. 1, there is shown a display unit 101, a system enclosure 103 and a keyboard 105. In general, the computer system typically includes disk drive units, mouse input devices, printers, network devices, CD drives and many other peripheral units. However, for purposes of illustrating the present invention, a more complicated system is not shown in order not to obfuscate the explanation of an exemplary embodiment which follows. Systems such as that illustrated in FIG. 1 will require EMC testing before they can be offered for sale to the public. Generally, EMC testing is mostly concerned with the CPU enclosure 103 since it is that unit which houses most of the computer components and includes an internal structural environment most likely to cause, support and/or enhance undesirable electromagnetic radiation.

Figure 2:
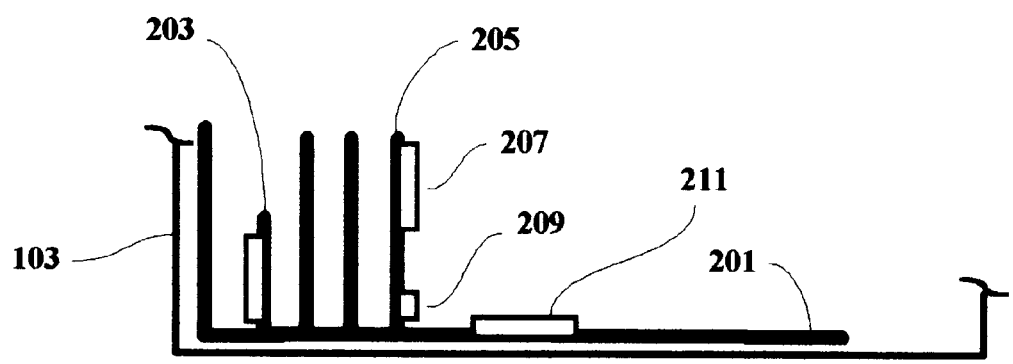
FIG. 2 is a simplified schematic drawing of a cutaway of a system enclosure showing a mother board with several component daughter boards mounted therein.

In FIG. 2, the CPU enclosure 103 is illustrated in a schematic cutaway view. Within the enclosure or box 103 there is typically mounted a motherboard 201 which is arranged to have smaller daughter boards or cards 203 mounted thereon and electrically connected thereto. The smaller boards may be of varying sizes to accommodate design criteria. Larger boards or cards 205 are mounted together with smaller boards or cards 203. The boards also have individual components of various sizes 207, 209 mounted thereon. With all of the various combinations of boards, cards, components and enclosure walls, many different arrangements are possible and each different arrangement of components within an electronics enclosure will create a different set of cavities (including spaces, crevices and gaps of various sizes and volumes) between and among the boards, the components and the enclosure walls. As operating frequencies of system CPUs are increased, and as the inside of the enclosures become more populated and crowded with devices, it is more likely that additional EM radiation will occur as more of the cavities support resonances at harmonics of the operating frequencies and actually enhance the EM radiated energy.

Figure 3:
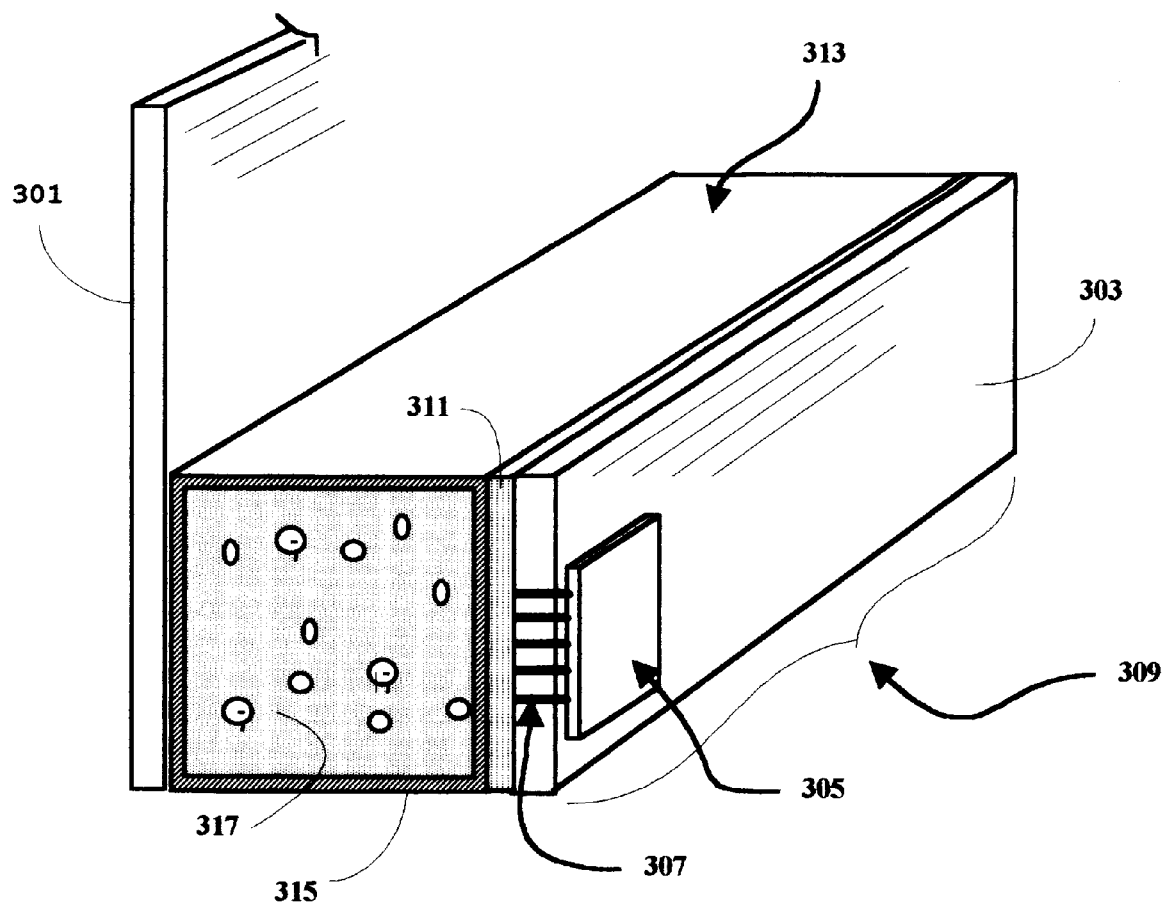
FIG. 3 is a simplified schematic drawing of a loading device in accordance with the present invention mounted between two component cards within an exemplary system enclosure.

In FIG. 3, a typical circuit board 301 is shown in a vertical position along with a smaller board 303 also mounted vertically. Although not shown, it is understood that these boards are electrically connected to a motherboard such as board 201 in FIG. 2. Also, board 301 will typically have components mounted thereon as illustrated in FIG. 2. It should be noted, however, that board 301 could also be a wall of a CPU enclosure or a wall of a compartment within a CPU enclosure since in either case the benefits of the present invention will still be effective to reduce emitted EM energy to acceptable levels. An electrical device 305, for example a voltage regulator device, is shown mounted on the board 303. Electrical connections 307 from the device 305 are only partially shown for the sake of clarity, it being understood that electrical connections from the device 305 are generally brought down to a connector at the bottom 309 of the board 303, usually by metal tracings on the board 303, for connection to a mother board as shown in FIG. 2.

Spacing material 311 is illustrated and is used to fill in spacings between board 303 and a loading device 313. The spacing material used in the present example was a flexible tape (3M type 4008 or equivalent) sufficiently thick to fill in the space and provide electrical insulation between the loading device 313 and the card 303. The spacing material was used in the present example for mechanical stability as well as for any radiation limiting effect it may have. The loading device 313 is the principal component in the EM emission control techniques disclosed herein. The loading device includes a lossy foam-type core element 317 and is surrounded by an electrically conductive envelope 315. The foam core 317 used in the present example is made of a type of thermal plastic extrusion "TPE" foam material. Other materials such a thermal plastic from "TPF" of foam material and other lossy foam materials which are commercially available from EMI materials manufacturers such as Advanced Performance Materials, of St. Louis, Mo. may also be used. The electrically conductive envelope 315 in the present example is made of a conductive nickel-copper (Ni/Cu) metallic fabric.

Figure 4:
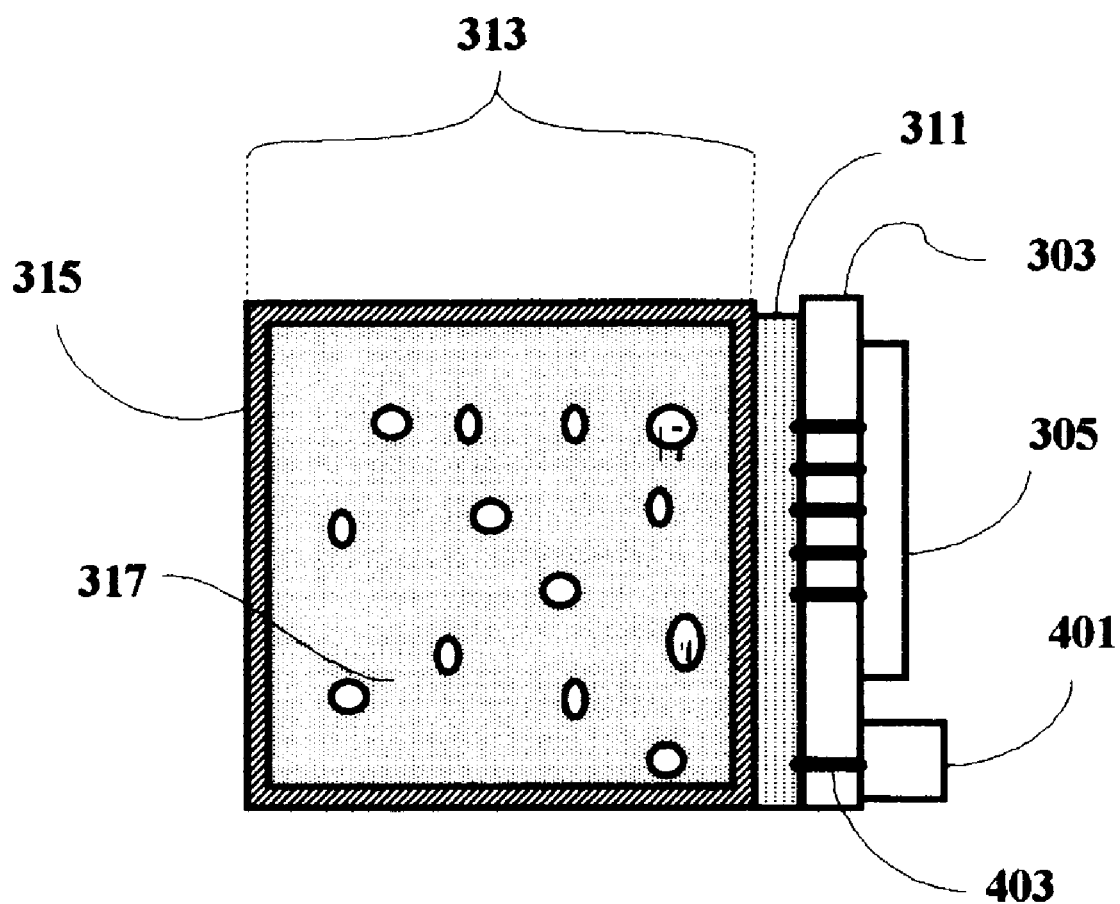
FIG. 4 is a schematic drawing showing the device illustrated in FIG. 3 including a spacer material used in the present example.

FIG. 4 illustrates the loading device 313 adjacent to the spacing material 311 which is placed between the board 303 and the loading device 313. A connector device 401 is effective to electrically connect the mounted component 305 by way of connectors 307 (FIG. 3) and 403, through the connector 401 to the motherboard as discussed earlier. FIG. 4 also shows the conductive envelope 315 and the foam core 317 which were discussed in the preceding paragraph.

The placement of the loading device 313 as shown, in proximity to the device 305 and between the device 305 and the wall or board 301, is effective to break up a previously existing resonant condition. After installing the loading device 313, all of the processor harmonics were spread out evenly and the computer system EMC was well under the regulatory limits. It is noted that no system enclosure level changes are required for the use of the loading device 313 and that no electrical connections of any sort, including grounding connections, are required. The loading device 313 is therefore electrically independent of any potential level in the system, and is electrically independent of the system grounding and the system shielding. This is a highly desirable feature since this remedy can be installed locally on an ad hoc basis and requires no special system or enclosure or board grounding or shielding devices or connections. The loading device can be modified in size to fit any cavity or space that may be available and useful to reduce radiation even after system final design and assembly.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A combination comprising:

an enclosure;

a first circuit board mounted within said enclosure;

a first electrical device, said first electrical device comprising at least one active electronic circuit component, said first electrical device being mounted to said first circuit board; and a loading device positioned within said enclosure in close proximity to said first electrical device, said loading device including a lossy component, said lossy component being operable to affect electromagnetic fields in the vicinity of said first electrical device, said loading device being positioned between said first circuit board and a side of said enclosure, said loading device being positioned to occupy a substantial portion of space between said first circuit board and said side of said enclosure.

2. The combination as set forth in claim 1 wherein said lossy component is comprised of a non-metallic material.

3. The combination as set forth in claim 1 wherein said combination further includes:
   a spacing component, said spacing component being arranged to occupy selected spaces adjacent said first electrical device between said loading device and said first circuit board.

4. The combination as set forth in claim 1 wherein said enclosure is arranged to further house a plurality of electrical devices connected together within an electrical system, said electrical system including connections to a system shielding network, said loading device being electrically independent of said system shielding network.

5. The combination as set forth in claim 1 and further including:
   a second circuit board mounted within said enclosure; and
   a second electrical device, said second electrical device being mounted on said second circuit board;
   a second loading device, said second loading device being positioned to occupy a substantial portion of space between said first and second circuit boards.

6. The combination as set forth in claim 1 wherein said enclosure is arranged to further house a plurality of electrical devices connected together within an electrical system, said electrical system including connections to a system shielding network, said loading device being electrically unconnected to said system shielding network.

7. The combination as set forth in claim 6 wherein said covering component is comprised of an electrically conductive material.

8. The combination as set forth in claim 7 wherein said electrically conductive material is comprised of a metallic material.

9. The combination as set forth in claim 8 wherein said metallic material is a flexible cloth-like metallic material.

10. The combination as set forth in claim 6 wherein said enclosure is arranged to further house a plurality of electrical devices connected together within an electrical system, said electrical system including connections to a system grounding network, said loading device being electrically unconnected to said system grounding network.

11. The combination as set forth in claim 6 wherein said enclosure is arranged to further house a plurality of electrical devices connected together within an electrical system, said electrical system including connections to a system shielding network, said loading device being electrically unconnected to said system shielding network.

12. The combination as set forth in claim 1 wherein said enclosure is arranged to further house a plurality of circuit boards including said first circuit board, said plurality of circuit boards being connected together within an electrical system, said electrical system including connections to a system grounding network, said loading device being electrically unconnected to said system grounding network.

13. The combination as set forth in claim 1 wherein said combination is contained within an enclosure, said enclosure being arranged to house a plurality of electrical devices connected together within an electrical system, said electrical system including connections to a system shielding network, said loading device being electrically unconnected to said system shielding network.

14. The combination as set forth in claim 1 wherein said enclosure is arranged to further house a plurality of electrical devices connected together within an electrical system, said electrical system including connections to a system grounding network, said loading device being electrically independent of said system grounding network.

15. A method for limiting electromagnetic radiation from an enclosure containing electronic components mounted on circuit boards, said circuit boards being spaced apart within said enclosure thereby defining unoccupied spaces within said enclosure between said circuit boards, said method comprising:
   sizing a loading device for installation within a selected one of said unoccupied spaces; and
   installing said loading device at said selected one of said unoccupied spaces, said loading device being installed in a manner by which said loading device is electrically unconnected to any system voltage reference, said sizing comprising shaping said loading device to fit said selected one of said unoccupied spaces within the enclosure, said shaping further including forming a first loading device component of a foam material shaped to conform to said selected one of said unoccupied spaces and enveloping at least a portion of said loading device component with a covering component.

* * * * *